US009231556B2

(12) United States Patent
Schmidhammer

(10) Patent No.: US 9,231,556 B2
(45) Date of Patent: Jan. 5, 2016

(54) ACOUSTIC WAVE FILTER HAVING REDUCED NON-LINEARITIES, AND METHOD FOR PRODUCTION

(75) Inventor: Edgar Schmidhammer, Stein an der Traun (DE)

(73) Assignee: EPCOS AG, Munich (DE)

(*) Notice: Subject to any disclaimer, the term of this patent is extended or adjusted under 35 U.S.C. 154(b) by 249 days.

(21) Appl. No.: 13/876,474

(22) PCT Filed: Aug. 25, 2011

(86) PCT No.: PCT/EP2011/064637
§ 371 (c)(1),
(2), (4) Date: Jun. 5, 2013

(87) PCT Pub. No.: WO2012/041615
PCT Pub. Date: Apr. 5, 2012

(65) Prior Publication Data
US 2013/0257562 A1    Oct. 3, 2013

(30) Foreign Application Priority Data

Sep. 28, 2010   (DE) .......................... 10 2010 046 794

(51) Int. Cl.
| H03H 9/00 | (2006.01) |
| H03H 9/64 | (2006.01) |
| H03H 9/145 | (2006.01) |
| H03H 9/72 | (2006.01) |

(52) U.S. Cl.
CPC ............. *H03H 9/64* (2013.01); *H03H 9/1452* (2013.01); *H03H 9/14517* (2013.01); *H03H 9/14597* (2013.01); *H03H 9/6483* (2013.01); *H03H 9/6496* (2013.01); *H03H 9/725* (2013.01)

(58) Field of Classification Search
None
See application file for complete search history.

(56) References Cited

U.S. PATENT DOCUMENTS

| 6,154,105 A * | 11/2000 | Fujimoto et al. ............... 333/194 |
| 6,351,197 B1 * | 2/2002 | Selmeier et al. ............... 333/195 |
| 2009/0115547 A1 * | 5/2009 | Mukai et al. ..................... 333/25 |
| 2009/0201104 A1 | 8/2009 | Ueda et al. |
| 2011/0187479 A1 * | 8/2011 | Takamine ..................... 333/133 |
| 2011/0210805 A1 | 9/2011 | Link et al. |

(Continued)

FOREIGN PATENT DOCUMENTS

| DE | 102008037091 A1 | 2/2010 |
| DE | 102008045346 A1 | 3/2010 |

(Continued)

OTHER PUBLICATIONS

Engan, H., "Excitation of Elastic Surface Waves by Spatial Harmonics of Interdigital Transducers", IEEE Transactions on Electron Devices, vol. ED-16, No. 12, Dec. 1969, pp. 1014-1017.

(Continued)

*Primary Examiner* — Lincoln Donovan
*Assistant Examiner* — Khareem E Almo
(74) *Attorney, Agent, or Firm* — McDermott Will & Emery LLP

(57) ABSTRACT

An acoustic wave filter having reduced non-linearities as well as a production method are disclosed. A filter comprises a first electroacoustic transducer having a first metallization ratio and a second electroacoustic transducer having a second metallization ratio. The metallization ratios range from 0.2 to 0.8, and the metallization ratio of the first transducer is no more than 0.8 times the metallization ratio of the second transducer.

11 Claims, 4 Drawing Sheets

(56) References Cited

U.S. PATENT DOCUMENTS

Figure 1:
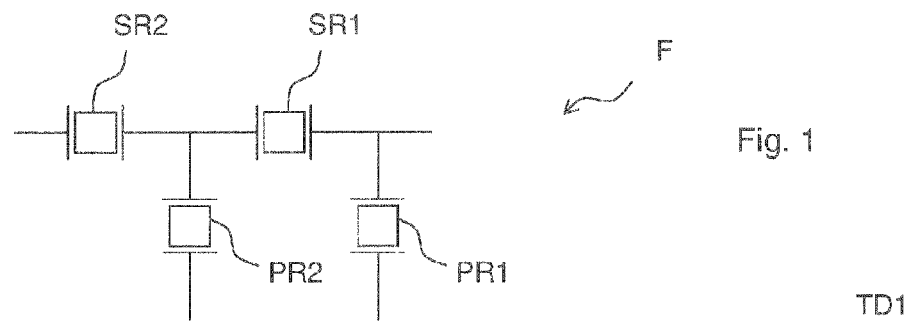

| | | | |
|---|---|---|---|
| 2012/0188026 A1* | 7/2012 | Yamaji et al. | 333/133 |
| 2013/0214873 A1* | 8/2013 | Takamine | 333/133 |
| 2013/0257562 A1* | 10/2013 | Schmidhammer | 333/133 |
| 2014/0028414 A1* | 1/2014 | Chamaly et al. | 333/193 |
| 2014/0320236 A1* | 10/2014 | Silver et al. | 333/186 |

FOREIGN PATENT DOCUMENTS

| | | |
|---|---|---|
| EP | 0978937 A1 | 2/2000 |
| EP | 1249933 A2 | 10/2002 |
| EP | 1267490 A2 | 12/2002 |
| EP | 1276235 A1 | 1/2003 |
| EP | 1280274 A2 | 1/2003 |
| EP | 1330027 A2 | 7/2003 |
| EP | 1976117 A2 | 10/2008 |
| JP | 2003332884 A | 11/2003 |
| JP | 2004-007094 A | 1/2004 |
| JP | 2006-270929 A | 10/2006 |
| JP | 2008-271511 A | 11/2008 |
| JP | 2010-021914 A | 1/2010 |
| WO | WO-2007114390 A1 | 10/2007 |
| WO | WO-2009/060594 A1 | 5/2009 |
| WO | WO-2010023168 A1 | 3/2010 |

OTHER PUBLICATIONS

Naumenko, N. et al., "Optimized Cut of Lithium Niobate for HVPSAW Filters with Different Metalization Ratio in Element Resonators", 2004 IEEE Ultrasonics Symposium Montreal, Canada, Aug. 2004, Bd 2, pp. 1213-1217.

* cited by examiner

ACOUSTIC WAVE FILTER HAVING REDUCED NON-LINEARITIES, AND METHOD FOR PRODUCTION

The invention relates to acoustic wave filters having reduced non-linearities and production methods.

In acoustic wave filters, electroacoustic transducers convert between RF signals and acoustic waves. Such transducers can be interdigital transducers (IDT) having a comb structure and can operate with surface acoustic waves (SAW) or with guided bulk acoustic waves (GBAW). Such transducers generally comprise interdigitating, but electrically insulated electrode fingers interconnected with busbars.

So-called non-linearities are problematic in known acoustic wave filters. The term non-linearity denotes the occurrence or arising of disturbing frequency components generated by filter structures not operating completely linearly. Intermodulation products, for example, are such non-linearities in active circuits, that is to say circuits which can comprise semiconductor components.

It is an object of the invention to specify acoustic wave filters having reduced non-linearities. A further object is to specify a method for producing an acoustic wave filter having reduced non-linearities.

These objects are achieved firstly by means of a filter according to claim 1 and secondly by means of a method according to the independent method claim.

For this purpose, an acoustic wave filter is specified which comprises a first electroacoustic transducer for surface acoustic waves or for guided bulk acoustic waves having a first metallization ratio $\eta_1$, and a second electroacoustic transducer having a second metallization ratio $\eta_2$. In this case, the following hold true:

$$0.2 \leq \eta_1 \leq 0.8$$

and $$0.2 \leq \eta_2 \leq 0.8$$

and $$\eta_1/\eta_2 \leq 0.8.$$

The metallization ratios $\eta_1$ and $\eta_2$ are therefore both between 0.2 and 0.8. The smaller metallization ratio is a maximum of 0.8 times the larger metallization ratio.

In this case, the metallization ratio $\eta$ establishes a measure of the surface area covered by electrode fingers in the transducer. The metallization ratio $\eta$ can be quantitatively specified substantially by the following formula:

$$\eta = d/(d+p).$$

In this case, d is the width of the electrode fingers and p is the (free) distance between adjacent electrode fingers. If the metallization ratio $\eta$ varies over the length of the transducer, then the abovementioned conditions correspondingly hold true for the average values of the metallizations.

It has been recognized that, in acoustic wave filters, disturbing frequency components based on non-linearities can be assigned to different orders: alongside the desired first-order basis frequencies, second-order, third-order and higher-order disturbing frequencies can occur. Third-order disturbances are particularly disturbing because their frequencies are of the order of magnitude of the basis frequencies—cf. FIG. 6.

What proves to be problematic, in principle, in the production of acoustic wave transducers is the patterning in the case of small metallization ratios:

In the lift-off method, for example, a first step involves applying a photosensitive resist to the piezoelectric substrate. Exposing and developing the resist produces a negative pattern of the electrode structure in the resist. Afterward, one or more metallizations, later constituting the electrode structure, is or are deposited over a large area onto the patterned resist or onto the uncovered regions of the substrate surface. In a lift-off step, the remaining resist together with the metallization deposited thereon is then removed, such that only the metallization arranged directly on the substrate remains as electrode structure. Particularly small metallization ratios $\eta$ are disadvantageous, then, in a manner governed by production, because, together with the residual resist, the metallization deposited on the substrate also concomitantly detaches from the substrate on account of its small lateral size and the consequently lower adhesion. The same analogously applies to similar patterning methods.

By virtue of the above-specified small, but not too small, metallization ratio for the first transducer, a filter is specified which has reduced non-linearities and can nevertheless be produced within required manufacturing tolerances.

Particularly in the case of patterning by means of DUV (deep ultraviolet) beams during the exposure of the resist, predefined manufacturing tolerances can readily be complied with. In this case, DUV beams can have a wavelength of 300 nm or less.

In one embodiment, the first transducer has a number of $N_1$ fingers and a static capacitance $C_{01}$. The second transducer has a number of $N_2$ fingers and a static capacitance $C_{02}$. In this case, $N_1 > N_2$ and the following holds true:

$$0.9 * C_{02} \leq C_{01} \leq 1.1 * C_{02}. \qquad (1)$$

The static capacitances of both transducers vary by not more than approximately 10%. The number of fingers is different, however.

In one embodiment, the first transducer has an aperture $W_1$ and the second transducer has an aperture $W_2$. In this case, $W_1 > W_2$.

It has been found that non-linearities can be reduced by the specific design features mentioned above.

In one embodiment, the filter is a duplexer having a transmission signal path (Tx path) and a reception signal path (Rx path). The first transducer and the second transducer are interconnected in series in a signal path, selected from Tx path or Rx path.

The first transducer and the second transducer are interconnected in series in a signal path, for which reason an RF signal propagating in the signal path passes through both transducers successively. It has been found that the interaction of the RF signal with these two transducers having different metallization ratios is such that non-linearities are reduced.

In one embodiment, the filter furthermore comprises a bulk acoustic wave (BAW) resonator. In this case, the first transducer and the second transducer are interconnected in series in the Rx path of the duplexer. The BAW resonator is interconnected in the Tx path. A circuit comprising SAW and BAW resonators is called a hybrid circuit. It is furthermore possible for the BAW resonator of a hybrid circuit to be interconnected in the Rx path.

BAW resonators have relatively high power strength and are therefore well suited to an interconnection in the Tx path of a duplexer in which a relatively powerful RF signal propagates.

In one embodiment of the duplexer circuit, a phase shifter is interconnected between the Tx path and the Rx path. In this case, such a phase shifter can comprise a $\lambda/4$ line. A phase shifter comprising LC elements is also appropriate as a phase shifter that occupies less space than a phase shifter comprising a λ/4 line.

Such a phase shifter is advantageously transmissive to reception signals or the frequencies thereof and blocks transmission signals or the frequencies thereof.

In one embodiment, the filter comprises an antenna connection. The first transducer is interconnected between the antenna connection and the second transducer.

It is also possible for the second transducer to be interconnected between the antenna connection and the first transducer.

In one embodiment of the filter, the first transducer and the second transducer have substantially the same static capacitance $C_0$ or differ by not more than 5% or 1% with regard to their static capacitances. The first transducer has more fingers or a smaller aperture than the second transducer.

In one embodiment, the acoustic wave filter comprises transducers embodied in a cascaded fashion. The transducers can be cascaded in series or in parallel.

The number of resonator cascades can be 1, 2, 3, 4, 5, 6, 7, 8, 9, 10 or more. The degree of the respective cascading can be 1, 2, 3, 4, 5, 6, 7, 8, 9, 10 or more. Such cascades, in particular of SAW resonators, require a multiple of the area on a substrate. However, the gain in quality as a result of a reduction of non-linearities may be more important than a design having the smallest area requirement—despite the constant trend toward miniaturization.

A method for producing an acoustic wave filter comprises the following steps:

providing a filter comprising a first transducer having a first metallization ratio $\eta_1$ and a second transducer having a second metallization ratio $\eta_2$, progressively reducing the ratio $\eta_1/\eta_2$ and determining the nonlinear components up to $\eta_1=0.2$ and $\eta_2=0.8$, determining and setting the ratio $\eta_1/\eta_2$ which is distinguished by the smallest undesirable frequency components.

The ratio $\eta_1/\eta_2$ is therefore reduced progressively, wherein the metallization ratio $\eta_1$ of 0.1 is not undershot and the metallization ratio $\eta_2$ of 0.9 is not exceeded. By way of example, $\Delta\eta_{1,2}=+-0.1$ or $\Delta\eta_{1,2}+-0.05$ or $\Delta\eta_{1,2}+-0.01$ is appropriate as step size in the variation of the metallization ratios $\eta_1$ or $\eta_2$.

Figure 2A:
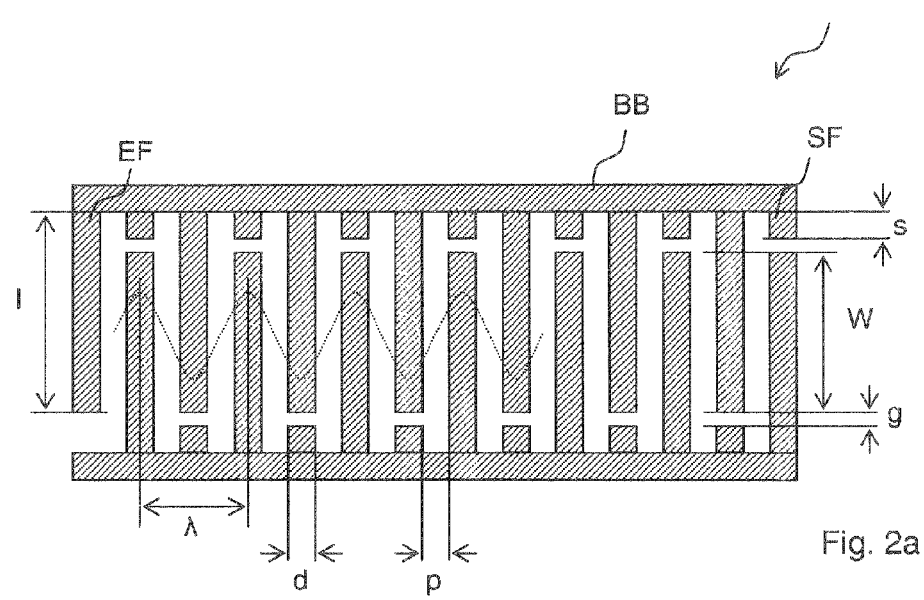
Figure 2B:
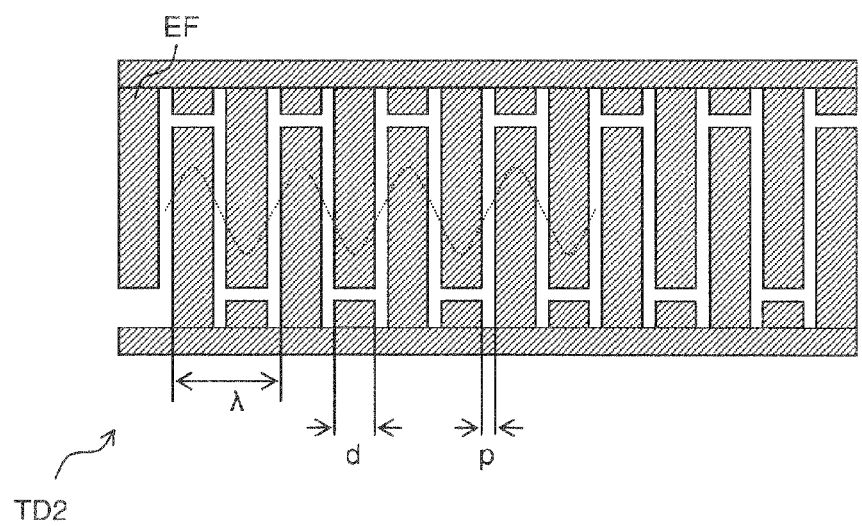
Figure 3:
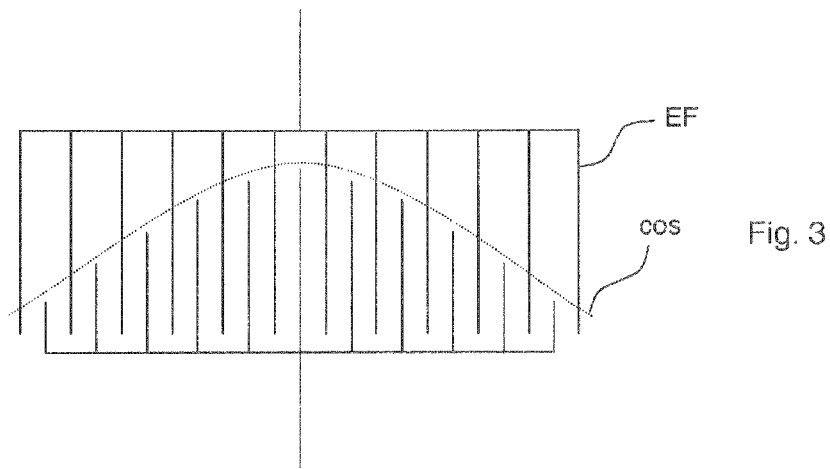
Figure 4A:
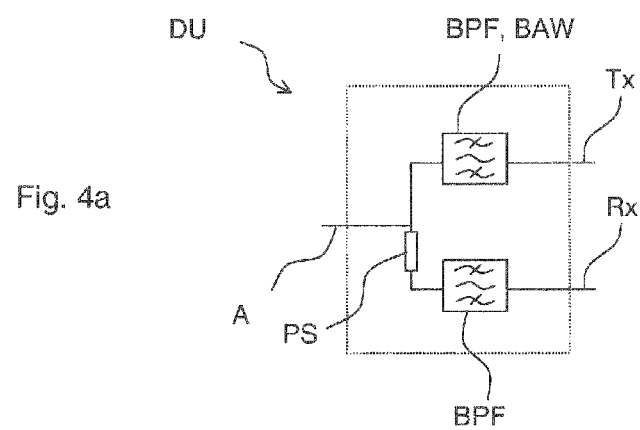
Figure 4B:
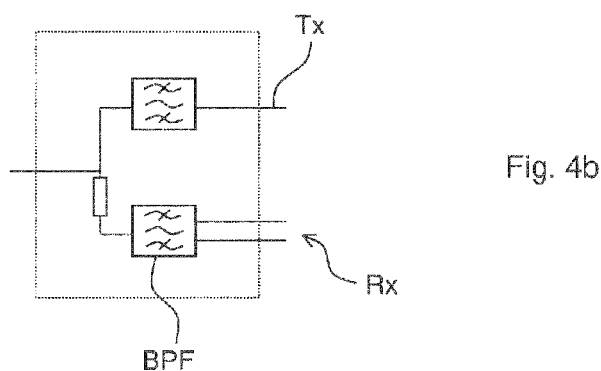
Figure 5A:
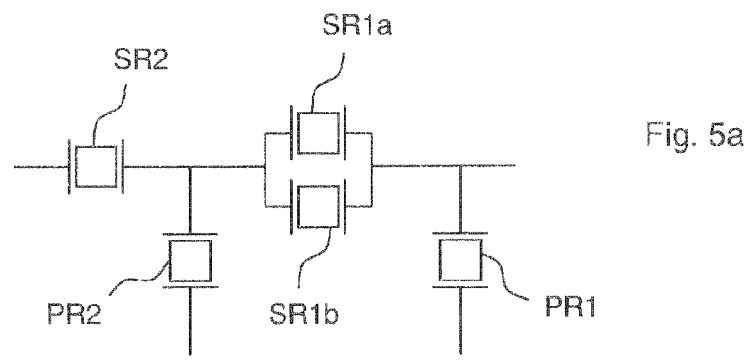
Figure 5B:
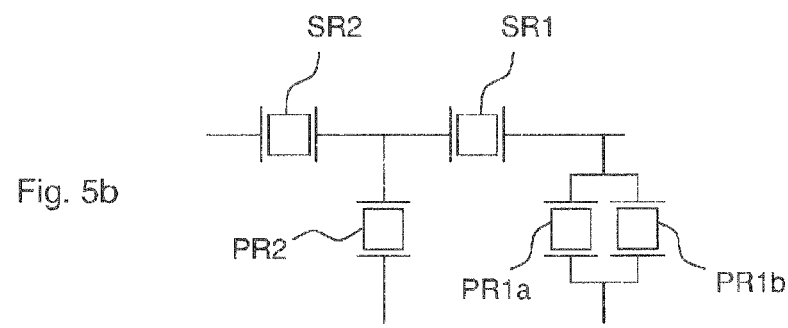
Figure 6:
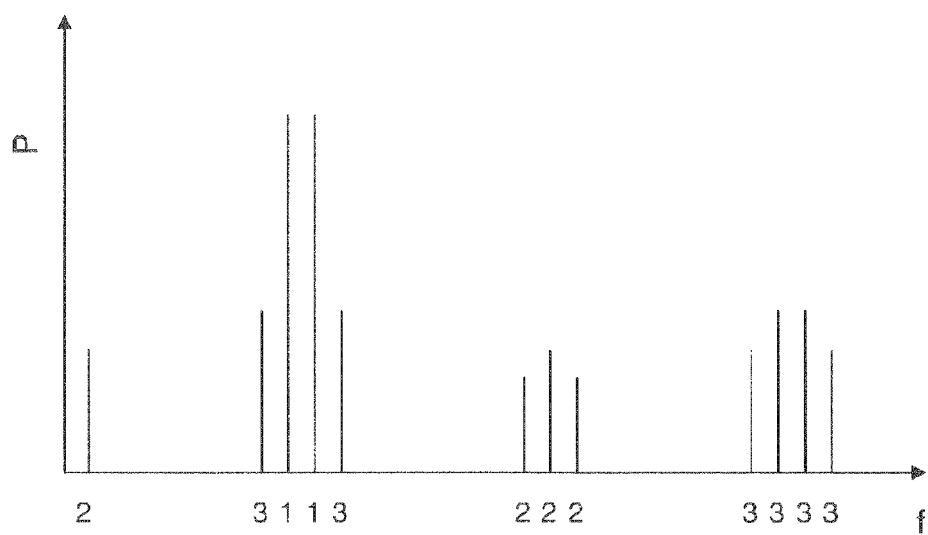
Figure 7:
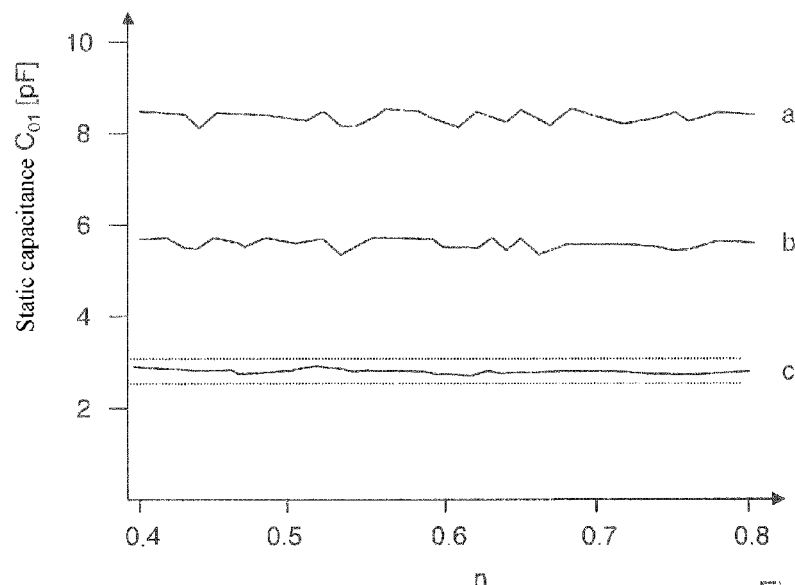
Figure 8:
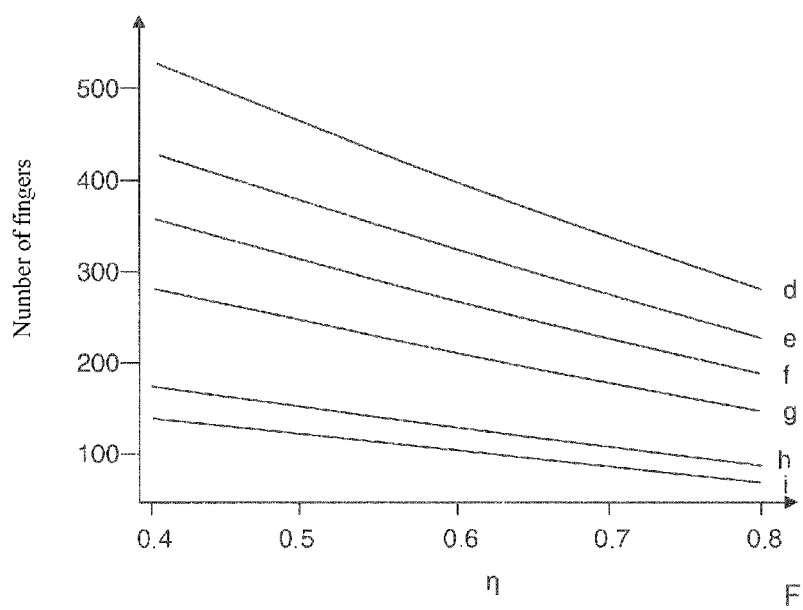

The invention is explained in greater detail below on the basis of exemplary embodiments and schematic figures, in which:

FIG. 1: shows a ladder type circuit comprising series and parallel resonators,

FIG. 2a: shows an electroacoustic transducer and some characteristic variables,

FIG. 2b: shows an electroacoustic transducer having a larger metallization ratio, FIG. 3: shows an electroacoustic transducer with overlap weighting, FIG. 4a: shows a duplexer, FIG. 4b: shows a duplexer with an Rx port balanced to ground, FIG. 5a: shows resonators cascaded in parallel in a signal path, FIG. 5b: shows resonators cascaded in parallel in a parallel path, FIG. 6: shows the relative frequency of different frequency components of different orders, FIG. 7: shows the static capacitances $C_0$ of various transducers for various metallization ratios, FIG. 8: shows the dependence of the number of fingers on the metallization ratio if a constant static capacitance $C_0$ is intended to be obtained.

FIG. 1 shows one possible embodiment of a filter F comprising a ladder type filter circuit having series resonators SR1, SR2 connected in series and parallel resonators PR1, PR2 interconnected in parallel paths. In order to obtain a filter circuit having reduced non-linearities, it is possible for the metallization ratios of the two series resonators SR1, SR2 to be configured to be different. However, it is also possible for the metallization ratios of the two parallel resonators PR1, PR2 to be configured to be different. Furthermore it is possible for metallization ratios of one of the series resonators SR1, SR2 and one of the parallel resonators PR1, PR2 to be different.

FIG. 2a schematically shows a first electroacoustic transducer TD1 for surface acoustic waves having electrode fingers EF, stub fingers SF and busbars BB. A dashed sinusoidal curve indicates an acoustic wave of wavelength λ propagating in the transducer. The width of the electrode fingers or of the stub fingers is designated by d; the distance between electrode fingers arranged alongside one another is designated by p. The metallization ratio thus substantially results as:

$$\eta=d/(d+p).$$

In this case, the sum d+p substantially determines the frequency of a transducer.

The overlap region of the electrode fingers EF, that is to say therefore the maximum occurring overlap length of two adjacent electrode fingers connected to different busbars, defines the aperture W. The transverse distance between the free end of an electrode finger of one electrode and the adjacent busbar BB or between the free end of an electrode finger and the end of an oppositely arranged stub finger SF of the other electrode is designated by gap g. The length of the individual electrode fingers EF is designated by l.

FIG. 2b shows a second transducer TD2, which has a different finger width b and a different finger distance p than the transducer TD1. Since the transducer TD1 has a smaller finger width b and a larger finger distance p than the transducer TD2, the transducer TD1 has a lower metallization ratio than the transducer TD2.

It has been found that the non-linearities can be reduced by optimizing these parameters. In the case of filter circuits comprising two transducers, it is shown that metallization ratios η set differently in both transducers bring about a reduction of the non-linearities.

FIG. 3 shows an electroacoustic transducer, wherein the overlap region of the electrode fingers varies along the propagation direction of the acoustic waves. In this case, the dashed line designated by "cos" symbolizes the extent of the overlap. The transducer shown in FIG. 3 has a so-called cosine weighting.

In this case, the metallization ratio can vary or be constant along the propagation direction of the acoustic waves.

FIG. 4a shows a duplexer circuit DU comprising an antenna connection A, a transmission signal path Tx and a reception signal path Rx. A respective bandpass filter BPF is interconnected both in the Tx path and in the Rx path. A bandpass filter BAW operating with bulk acoustic waves is interconnected here in the transmission signal path Tx. An SAW bandpass filter BPF operating with surface acoustic waves is interconnected in the reception signal path Rx. A phase shifter PS is interconnected between the antenna connection A and the bandpass filter BPF of the Rx path. This makes it possible to minimize the current density, in particular at reception frequencies, and thus to minimize non-linearities.

FIG. 4b shows a duplexer circuit which differs from the duplexer circuit DU in FIG. 4a to the effect that the Rx port is embodied as balanced to ground—i.e. balanced. For this purpose, the bandpass filter BPF interconnected in the Rx path can itself comprise a balun functionality.

FIG. 5a shows a filter circuit. This filter circuit differs from the filter circuit F in FIG. 1 in that a series resonator is embodied in a manner cascaded in parallel. The parallel cascade comprises the two resonators SR1a and SR1b. In the interconnection, the two cascaded resonators SR1a and SR1b are in this case dimensioned such that they have substantially together that impedance which an individual, non-cascaded resonator would have in the original, non-cascaded interconnection.

FIG. 5b shows a filter circuit which differs from the filter circuit F in FIG. 1 in that a parallel resonator is embodied in a manner cascaded in parallel. The parallel cascade comprises the two resonators PR1a and PR1b. In this case, the interconnection of the two cascaded resonators PR1a and PR1b has substantially that impedance which an individual, non-cascaded resonator would have.

An improvement in the linearity could be expected in the case of serial cascades because the voltage present per transducer decreases. However, two transducers cascaded in series require substantially four times the area on a piezoelectric substrate in order that the impedance of the serial cascade corresponds to the impedance of the replaced transducer.

It has now been discovered that parallel cascades can also significantly improve the linearity of filter circuits. This is advantageous insofar as transducers cascaded in parallel do not have an increased area requirement on the substrate. Additional signal lines themselves require only little additional area.

FIG. 6 illustrates the relative arrangement of the frequencies f of RF signals of different orders. The ordinate is a measure of the power P. Desired first-order basis frequencies are designated by "1". The absolute values of the second-order disturbing frequencies, "2", differ from the basis frequencies substantially by the absolute values of the basis frequencies themselves. Therefore, the frequency differences between basis frequencies "1" and second-order disturbing frequencies "2" are relatively large; such frequencies can be eliminated well by bandpass filters, high-pass filters or low-pass filters.

Frequencies designated by "3" are third-order disturbing frequencies. These differ from second-order disturbing frequencies "2" by frequency differences of the magnitude of the basis frequencies. Therefore, third-order disturbing frequencies generally exist approximately at frequencies of the basis signals. Such disturbing frequencies "3" cannot be filtered out, or cannot be sufficiently filtered out, by conventional filter measures.

The present invention specifies measures such that these poorly eliminable third-order disturbing frequencies "3" cannot arise in the first place or can arise only with reduced intensity. Filters having a reduced intensity of third-order disturbing frequencies "3" are therefore specified.

FIG. 7 shows the static capacitances $C_0$ of various transducers. Curves "a", "b" and "c" show the calculated static capacitances of transducers having a set capacitance. The apertures of all three transducers are constant in this case. In all three curves, the metallization ratio $\eta$ is varied between 0.4 and 0.8. It can clearly be discerned that the respective static capacitances can be set substantially independently of their metallization ratio.

The static capacitances can in each case be correspondingly obtained by setting the aperture or, in particular, the number of fingers in accordance with equation (1).

The dashed lines around curve "c", for example, indicate capacitances of approximately 110% and respectively of 90% of a reference capacitance—cf. equation (1).

FIG. 8 shows the number of fingers for transducers having a constant static capacitance in FIG. 7 when the metallization ratio $\eta$ is varied. The curves "d" and "e" represent transducers having the static capacitance of the curve a in FIG. 7. The curves "f" and "g" represent transducers having the static capacitance of the curve "b". The curves "h" and "i" represent transducers having the static capacitance of the curve "c".

The following holds true for transducers having a metallization ratio of $\eta=0.65$, for example:

In an embodiment in accordance with curve "d", a transducer has 375 electrode fingers and an aperture of 80 μm.

In an embodiment in accordance with curve "e", a transducer has 300 electrode fingers and an aperture of 100 μm.

In an embodiment in accordance with curve "f", a transducer has 250 electrode fingers and an aperture of 80 μm.

In an embodiment in accordance with curve "g", a transducer has 200 electrode fingers and an aperture of 100 μm.

In an embodiment in accordance with curve "h", a transducer has 125 electrode fingers and an aperture of 80 μm.

In an embodiment in accordance with curve "i", a transducer has 100 electrode fingers and an aperture of 100 μm.

FIGS. 7 and 8 therefore show how the metallization ratio of transducers can be varied, on the one hand, in order to reduce non-linearities and, on the other hand, desired static capacitances can be maintained. The setting of the static capacitances is important for example for the impedance matching of filter circuits.

A filter according to the invention and a production method according to the invention are not restricted to one of the exemplary embodiments described. Combinations of the exemplary embodiments likewise constitute exemplary embodiments according to the invention. In particular, the designations "first" and "second" transducer do not represent a positional specification for the transducers in a circuit.

LIST OF REFERENCE SIGNS 1, 2, 3: First-, second-, third-order frequencies
a, b, c, Static capacitance
d, e, f,
g, h, i: Number of fingers
A: Antenna connection
BAW: Bulk acoustic wave bandpass filter
BB: Busbar
BPF: Bandpass filter
COS: Cosine weighting
d: Finger width
DU: Duplexer
EF: Electrode finger
F: Filter
g: Distance between electrode finger and opposite electrode or opposite stub finger
l: Length of the electrode fingers
λ: Wavelength of the acoustic wave
p: Finger distance
PR1, PR2: Parallel resonators
PS: Phase shifter
Rx: Reception signal path S: Length of the stub fingers
SF: Stub finger
SR1, SR2: Series resonators
TD1, TD2: First transducer, second transducer
Tx: Transmission signal path
W: Aperture

The invention claimed is:

1. An acoustic wave filter, comprising:
a first electroacoustic transducer for surface acoustic waves or for guided bulk acoustic waves having a first metallization ratio $\eta_1$;
a second electroacoustic transducer having a second metallization ratio $\eta_2$, wherein the following hold true:

$0.2 \leq \eta_1 \leq 0.8$, $0.2 \leq \eta_2 \leq 0.8$ and $\eta_1/\eta_2 \leq 0.8$; and an antenna connection, wherein the first electroacoustic transducer is interconnected between the antenna connection and the second electroacoustic transducer.

2. The acoustic wave filter according to claim 1, wherein the first electroacoustic transducer has $N_1$ fingers and a static capacitance $C_{01}$, the second electroacoustic transducer has $N_2$ fingers and a static capacitance $C_{02}$, and wherein the following hold true:

$N_1 > N_2$ and $0.9 * C_{02} \leq C_{01} \leq 1.1 * C_{02}$.

3. The acoustic wave filter according to claim 1 or 2, wherein the first electroacoustic transducer has an aperture $W_1$ and the second electroacoustic transducer has an aperture $W_2$, and wherein the following holds true: $W_1 > W_2$.

4. The acoustic wave filter according to claim 1, wherein the acoustic wave filter is a duplexer having a Tx path and an Rx path, and the first electroacoustic transducer and the second electroacoustic transducer are interconnected in series in a signal path, selected from the Tx path or the Rx path.

5. The acoustic wave filter according to claim 4, further comprising:
a BAW resonator,
wherein the first electroacoustic transducer and the second electroacoustic transducer are interconnected in series in the Rx path and the BAW resonator is interconnected in the Tx path.

6. The acoustic wave filter according to claim 4 or 5, wherein a phase shifter is interconnected between the Tx path and the Rx path.

7. The acoustic wave filter according to claim 1, wherein the first electroacoustic transducer and the second electroacoustic transducer have the same static capacitance $C_0$ and the first electroacoustic transducer has more fingers or a smaller aperture than the second electroacoustic transducer.

8. The acoustic wave filter according to claim 1, comprising transducers cascaded in parallel.

9. A method for producing an acoustic wave filter, comprising the following steps:
providing an acoustic wave filter according to claim 1, the acoustic wave filter comprising the first electroacoustic transducer having the first metallization ratio $\eta_1$ and the second electroacoustic transducer having the second metallization ratio $\eta_2$;
progressively reducing the ratio $\eta_1/\eta_2$ and determining the nonlinear components up to $\eta_1=0.2$ and $\eta_2=0.8$; and
setting the ratio $\eta_1/\eta_2$ which is distinguished by the smallest undesirable frequency components.

10. An acoustic wave filter, comprising:
a first electroacoustic transducer for surface acoustic waves or for guided bulk acoustic waves having a first metallization ratio $\eta_1$; and
a second electroacoustic transducer having a second metallization ratio $\eta_2$, wherein the following hold true:

$0.2 \leq \eta_1 \leq 0.8$, $0.2 \leq \eta_2 \leq 0.8$ and $\eta_1/\eta_2 \leq 0.8$, wherein the acoustic wave filter is a duplexer having a Tx path and an Rx path, and the first electroacoustic transducer and the second electroacoustic transducer are interconnected in series in a signal path, selected from the Tx path or the Rx path; and
a BAW resonator, wherein the first electroacoustic transducer and the second electroacoustic transducer are interconnected in series in the Rx path and the BAW resonator is interconnected in the Tx path.

11. An acoustic wave filter, comprising:
a first electroacoustic transducer for surface acoustic waves or for guided bulk acoustic waves having a first metallization ratio $\eta_1$; and
a second electroacoustic transducer having a second metallization ratio $\eta_2$, wherein the following hold true:

$0.2 \leq \eta_1 \leq 0.8$, $0.2 \leq \eta_2 \leq 0.8$ and $\eta_1/\eta_2 \leq 0.8$, wherein the acoustic wave filter is a duplexer having a Tx path and an Rx path, and the first electroacoustic transducer and the second electroacoustic transducer are interconnected in series in a signal path, selected from the Tx path or the Rx path, and
wherein a phase shifter is interconnected between the Tx path and the Rx path.

* * * * *